(12) United States Patent
Fürst et al.

(10) Patent No.: US 6,888,408 B2
(45) Date of Patent: May 3, 2005

(54) PREAMPLIFIER FOR TWO TERMINAL ELECTRET CONDENSER MICROPHONES

(75) Inventors: Claus Erdmann Fürst, Roskilde (DK); Tomasz Marczak, Roskilde (DK)

(73) Assignee: Sonion Tech A/S, Roskilde (DK)

( * ) Notice: Subject to any disclaimer, the term of this patent is extended or adjusted under 35 U.S.C. 154(b) by 63 days.

(21) Appl. No.: 10/644,743

(22) Filed: Aug. 21, 2003

(65) Prior Publication Data

US 2004/0085137 A1 May 6, 2004

Related U.S. Application Data

(60) Provisional application No. 60/406,062, filed on Aug. 27, 2002.

(51) Int. Cl.$^7$ .................................................. H03F 3/16
(52) U.S. Cl. ......................... 330/277; 330/310; 330/311; 381/120
(58) Field of Search .................................. 330/277, 310, 330/311; 381/120

(56) References Cited

U.S. PATENT DOCUMENTS 3,825,849 A    7/1974  Linder
4,163,197 A  * 7/1979  Sampei .......................... 330/263
4,301,416 A  * 11/1981 Perahia .......................... 318/677
5,589,799 A  * 12/1996 Madaffari et al. ............ 330/277
6,160,450 A    12/2000 Eschauzier et al.
6,211,738 B1 * 4/2001  Hecht ........................... 330/292

FOREIGN PATENT DOCUMENTS

EP            0969695 A1        1/2000

* cited by examiner

*Primary Examiner*—Patricia Nguyen
(74) *Attorney, Agent, or Firm*—Hareness, Dickey & Pierce PLC

(57) ABSTRACT

The present invention relates to a preamplifier suitable for use with Electret Condenser Microphones such as used within telecommunication equipment. More particularly the invention relates to a preamplifier specially suited for the demands to such a preamplifier within telecommunication equipment: low input capacitance, gain and a combined terminal for output and supply voltage, thus making the preamplifier suitable for two terminal microphone assemblies. These features are obtained with a two stage amplifier with a first stage optimised for low input capacitance and the second stage being able to provide gain. The preamplifier may be implemented using an ASIC, thus making the preamplifier suitable for applications with very limited space available, such as for integration within microphone assemblies.

17 Claims, 2 Drawing Sheets

PREAMPLIFIER FOR TWO TERMINAL ELECTRET CONDENSER MICROPHONES

This application claims benefit of Provisional No. 60/406,062 filed Aug. 27, 2002.

FIELD OF THE INVENTION

This invention relates to a preamplifier for amplifying the electrical signal from a transducer such as a microphone cartridge. More particularly, the preamplifier is especially designed for two terminal miniature ECM (Electret Condenser Microphones) assemblies such as used in telecommunication equipment.

BACKGROUND OF THE INVENTION

Typically, current microphone assemblies for telecommunication applications are constituted by two terminal ECMs. A two terminal ECM assembly typically comprises a housing, an electret condenser microphone cartridge, and an integrated preamplifier, the assembly having only two terminals outside the housing: one terminal for ground and one terminal for signal output combined with supply voltage. The advantage of the two terminal design within cost sensitive telecommunication equipment is that the production costs can be decreased with reduced (e.g. from three to two terminals) number of terminals. Microphone assemblies for other applications, for example hearing aids, typically have three terminals: ground, output, and supply voltage. Within hearing aids other parameters control the preferred designs.

Currently, the preamplifiers used in such two terminal ECMs are designed using a single JFET transistor in a gain or a unity gain configuration. This has been a successful solution for many years providing low noise and gain in two terminal telecommunication ECM assemblies. But recently, the size of the ECM cartridges has shrinked dramatically, whereby the intrinsic sensitivity of the ECM cartridge is decreased compared to todays standards. Also the source capacitance of the ECM cartridge itself has been dramatically reduced—from the order of 10 pF down to typically 2–2.5 pF.

Prior art, constituted by a preamplifier with a JFET, typically has an input capacitance of 5–10 pF thus making the input capacitance of the preamplifier high compared to the ouput capacitance of the microphone cartridge. Therefore, the signal from the cartridge is unintentionally damped already before the first amplifier stage, thus lowering the sensitivity of the entire microphone assembly. Combined with the low sensitivity of the ECM cartridges themselves, the result is a poor noise performance e.g. expressed as a low Signal-to-Noise-Ratio (SNR).

A possible solution to the SNR problem is to use a MOS transistor in a source follower configuration as input device instead of a JFET. This may provide a very low input capacitance as well as low noise. However, using a MOS transistor as input device will give problems if gain is needed—such as normally required for use in a two terminal microphone assembly for telecommunication equipment. In order to achieve gain in a two terminal ECM traditionally a NMOS transistor in a 'common source' configuration is needed. If this should exhibit low noise then the NMOS transistor needs to be fairly large in size. On the other hand a large NMOS will have a fairly large input capacitance. A PMOS transistor may then in principle be used. However, in practice it has a number of disadvantages such as a large input capacitance and a poor power supply rejection ratio (PSRR) as it will reference the positive supply rail.

EP 0 969 695 A1 describes a preamplifier for use within a different technical field, hearing aids. The preamplifier described in EP 0 969 695 A1 enables an input capacitance of only 1.6 pF (column 4, line 46). However, the design has a number of disadvantages regarding use within telecommunication equipment, even though it is stated in column 3, lines 3–5, that the invention is applicable within this field as well. Within hearing aids it is not necessary to amplify the signal in the preamplifier stage due to the use of more expensive but high sensitivity microphone cartridges, whereas there is a requirement for an amplification factor larger than 1 within telecommunication equipment featuring low cost and low sensitivity cartridges. Therefore, preamplifiers for use within hearing aids are optimised with respect to low input capacitance only, and not with respect to large amplification. In addition, the preamplifier disclosed in EP 0 969 695 A1 requires three terminals out from the microphone assembly housing, namely the terminals marked "−", "+", and "OUT" in FIGS. 3, 4a and 4b. For applications within telecommunication equipment it is a strict requirement to have only two terminals from the microphone assembly. Therefore, the amplifier design described in EP 0 969 695 is not suitable for use within telecommunication equipment.

In U.S. Pat. No. 6,160,450, a two terminal microphone preamplifier is disclosed. This amplifier uses the priniciple of a differential input stage consisting of two PMOS transistors and a 'open collector' bipolar transistor as output device. Major disadvantages of the design of U.S. Pat. No. 6,160,450 are the introdution of additional noise from using a differential pair at the input, the Miller multiplication of gate-drain capacitance in the input stage adding to overall input capacitance of the preamplifier and finally the use of a mixed MOS/bipolar technology which may increase costs to realize the circuit.

In conclusion, the commonly known preamplifier designs for two terminal ECM miniature microphone assemblies known within the art of telecommunication equipment are insufficient to comply with the demands arising from the latest miniature ECM cartridges. Even though solutions to some of the new problems can be found within related arts, such as hearing aids, these solutions give rise to other problems that make them unsuitable within telecommunication equipment. These technical problems relate to the number of terminals required and the provided gain.

SUMMARY OF THE INVENTION

Therefore, it is an object of the present invention to provide a preamplifier design adapted for application with the latest miniature microphone cartridges such as used within the technical field of telecommunication equipment. In addition, it is an object that the preamplifier is suited for production at low cost and that it is suited for miniature microphone assemblies with very limited space available.

The above mentioned object is provided in a first aspect of the present invention by providing an preamplifier comprising a first and a second stage, wherein
  the first stage comprises a PMOS transistor having an input capacitance smaller than 10 pF on its input terminal, and wherein
  the second stage, comprising a NMOS transistor, is adapted to receive and amplify a signal from the first stage, the amplification of the received signal in the second stage being different from 1,
  wherein the amplified signal from the second stage is provided to an output terminal, said output terminal further being adapted to receive power from an external power supply so as to provide power to the preamplifier.

The idea of using a two stage preamplifier allows optimisation of both input capacitance and gain, since the two amplifier stages can be optimised independently. The first stage can be optimised for minimum input capacitance and the second stage can be optimised for with respect to the gain, which is preferably larger than 1.

Furthermore, the object is provided according to the invention by a preamplifier, wherein the amplified signal from the second stage is provided to an output terminal, said output terminal further being adapted to receive power from an external power supply in order to power the preamplifier. With a preamplifier according to the invention it is thus possible to implement a microphone assembly with only two terminals—one ground and one for combined output and power supply. The design is also suited for miniature equipment. For example it can be implemented as an ASIC (Application Specific Integrated Circuit). Therefore, the invention is a solution to the problem of providing a preamplifier design adapted for application with the latest miniature microphone cartridges within telecommunication equipment.

By implementing the preamplifier using an ASIC, preferably as an ASIC, it is, according to the invention, possible to provide a preamplifier, wherein channel lengths and channel widths of the PMOS transistor are adjusted so as to obtain maximum SNR for a specific transducer connected to the input terminal of the first stage. The maximum SNR is obtained as the best compromise between on one hand the noise in the transistor and on the other hand the damping by the preamplifier input capacitance of the signal from the microphone cartridge.

The preamplifier may further comprise means for providing EMI protection. This EMI protection means may comprise an on chip resistor connected to the input terminal of the preamplifier. Alternatively, the EMI protection means may comprise an on chip capacitor connected between the output terminal and the ground terminal of the pre-amplifier.

The preamplifier may further comprise filter means adapted to receive signals from the first stage of the preamplifier. An output signal from the filter means may be provided as an input signal to the second stage of the preamplifier. The the filter means may comprise a low pass filter, a high pass filter, a notch filter, or any combination thereof.

The preamplifier may further comprise at least one bias generator for setting idle current and idle voltage of at least one of the preamplifier stages.

In a second aspect of the present invention the object is provided by a microphone assembly comprising
a microphone assembly housing having a sound inlet port,
a transducer for receiving acoustic waves, and for converting the received waves to analog signals, and
a preamplifier according to the above mentioned aspect, wherein the preamplifier is connected to the transducer via its input terminal so as to receive the analog transducer signal from the transducer.

Furthermore, according to the second aspect of the invention the object is provided by a microphone assembly, wherein the transducer and the preamplifier are positioned within the microphone assembly housing, and wherein the output terminal from the preamplifier is externally accessible.

BRIEF DESCRIPTION OF DRAWINGS

In the following the invention will be explained in detail with reference to the accompanying figures, in which.

Figure 1:
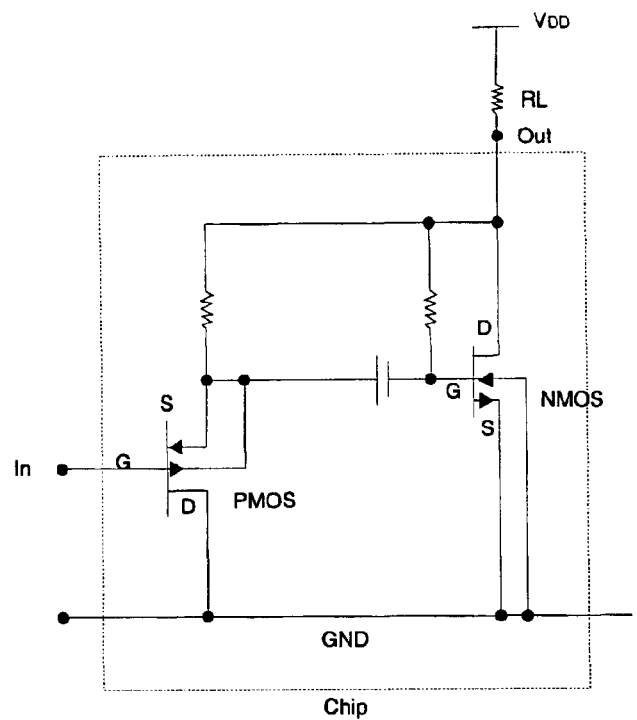
FIG. 1 shows an electric diagram of a simple embodiment of the invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF INVENTION

FIG. 1 shows a simple embodiment of the present invention implemented using only one transistor per amplifier stage—a PMOS transistor in the input stage and an NMOS transistor in the output stage. The input terminal to be connected to a device such as an ECM transducer is marked "IN" and "GND". The two output terminals are marked "OUT" and "GND". The supply voltage, marked "$V_{DD}$" on FIG. 1, is supplied via the "OUT" terminal through the load resistance (marked as "$R_L$"). Other external components may be used to connect to the "OUT" terminal for applying supply voltage. In this configuration the preamplifier is suited for use in a two terminal microphone assembly such as for telecommunication equipment. However, the power supply for the circuit may also be a separate terminal, if desired.

The first transistor stage can be configured as a PMOS source follower, such as shown in FIG. 1. This configuration gives the smallest possible input capacitance, the highest SNR, and at the same time an ability to handle very large signals without distortion. In order to obtain the best SNR the geometry of the input device has to be designed to fit the capacitance of the transducer element. Furthermore, it might be implemented as an Operational Transconductance Amplifier (OTA) or as a Voltage Operational Amplifier (VOA). The first stage may further comprise further features such as a buffer for reducing the out impedance so as to put even less restrictions on the second stage.

The second transistor stage can be implemented in many ways. Examples of such are common source amplifiers, differential pair amplifiers etc. Furthermore, it might be implemented as an OTA or as a VOA. In case of an OTA the gain is dependent on the external resistor load. In case a VOA it is not. As the output impedance of the first stage is relatively low then the constraints on the second transistor stage are relaxed. I.e. the geometry of the transistor in the second stage can be designed independently of the output capacitance of the microphone cartridge. This gives the freedom to design the second stage such as an NMOS common source amplifier optimised for high SNR and a large gain. Normally, such a device has a large input capacitance but due to the fact that the first stage has a low output impedance then this has no negative consequences. The second stage may further comprise more transistors for providing even larger amplification and/or it may comprise buffers so as to provide a low output impedance.

Figure 2:
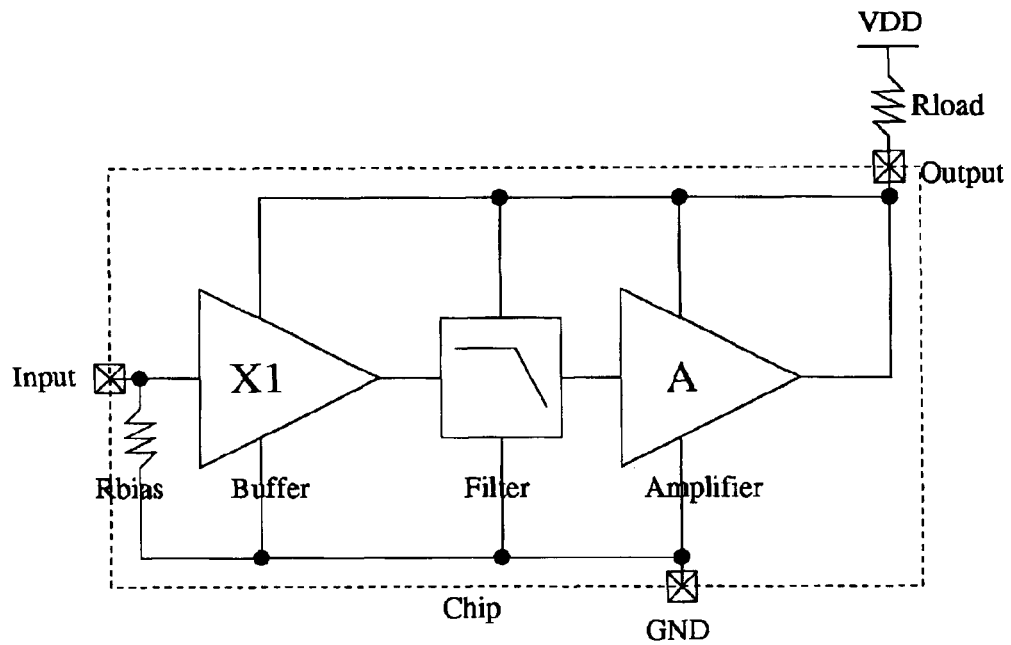
FIG. 2 shows a block diagram of a preferred embodiment of the invention.

In FIG. 1, the two stages of the preamplifier are connected in a simple way to each other. The two stages can also be connected via a filter section, alternatively a level shifter, or a combination thereof. FIG. 2 shows the principle of a filter connected between the two stages of the preamplifier. The filter section serves the purpose of removing signals which are unwanted and which might overload the second stage thus creating unwanted distortion. The filter shown in FIG. 2 is a lowpass filter, but it could alternatively be a highpass or notch filter, or any combination of the filters mentioned.

Biasing of the two stages can be set by a biasing generator or by simply setting the bias conditions using resistors and self biased circuits, such as shown in FIG. 1. For setting the bias voltage on the input an external or an on chip resistor can be used, such as the resistor $R_{bias}$ shown in FIG. 2. Such a resistor can be implemented using on or more diodes or by active components. If a filter block inserted between the two amplifier stages includes a highpass filter section then the bias conditions of the second stage can be set independently of the first stage. A level shifter between the two stages would serve the same purpose as to set the bias conditions of the second stage independently of the first stage.

Figure 3:
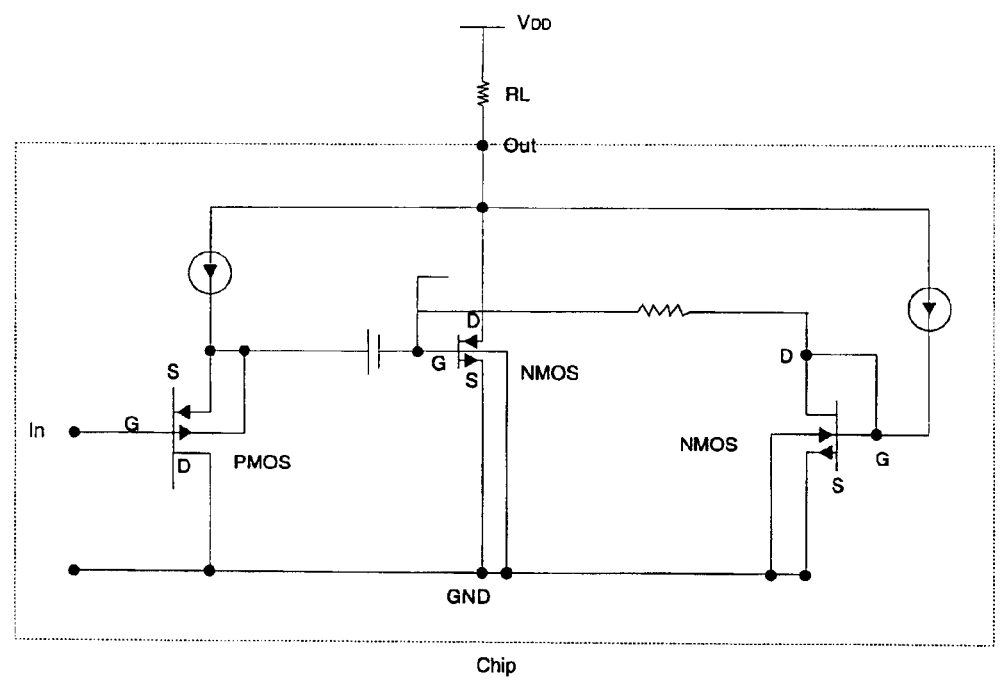
FIG. 3 shows an electric diagram of yet another preferred embodiment.

FIG. 3 shows a preferred embodiment of the preamplifier comprising two transistor stages and a bias generator for the second stage. As in FIG. 1 the first stage is based on a PMOS transistor, and the second stage and the bias generator are formed by NMOS transistors. In the embodiment shown in FIG. 3 the biasing of the first and last stages are shown as current sources or bias generators for setting the idle current and idle voltage of each of the preamplifier stages. These current sources can be implemented in a more or less comprehensive way, such as formed by a single transistor or formed by a circuit comprising several different components.

The embodiments shown in FIGS. 1 and 3 both use PMOS transistors in the first stage and NMOS transistors in the second stage. An advantage of the present invention is that there is very little restriction on the second stage. Therefore, especially the second stage can be implemented using a large variety of technologies, or combinations of technologies in case of the second stage comprising more than one transistor. Possible technologies for transistors in the second stage comprise the following: MOS, FET and bipolar transistors.

It should be noted, that the embodiments shown in FIGS. 1 and 3, the overall gain of the preamplifier is partly defined by the load resistance.

In order to save space and reduce cost the first and the second transistor stage (as indicated by stippled box in FIG. 1) are preferably integrated on a chip as to form an integrated circuit. Such a chip may be implemented monolithically as to form an ASIC (Application Specific Integrated Circuit). Implemented as an ASIC, the preamplifier is suited for applications with very limited space available, such as in telecommunication equipment. For example the preamplifier can be built into the housing of a microphone assembly.

An additional advantage of implementing the preamplifier on an ASIC instead of using discrete components is the possibility of optimising each transistor with respect to the drain-source channel length and channel width. The intrinsic noise of a transistor stage is decreased when the gate area is increased. However, the input capacitance increases with increased gate area. In this way the signal from the transducer is attenuated thus reducing the SNR as described above. Therefore, by designing the ASIC the possibility of adjusting the channel length and channel width of the input MOS transistor offers the possibility of optimising SNR of the preamplifier when used with a given specific transducer. This is not possible to the same degree using discrete components since this would require transistors available with custom transistor parameters. Once such an ASIC has been produced with a design optimised for a specific transducer, it is not possible to adjust the parameters in order to optimise the noise performance to another transducer.

In ASIC design it is often preferred to implement passive electronic components (resistors, capacitors) using transistors. This is both due to an improved performance and due to lower production costs.

When the preamplifier is implemented on an ASIC it is possible to add other features on the ASIC as well. These features may comprise on chip RF filters to shield the sensitive analog signal processing blocks against Electro Magnetic Interference (EMI). These filters can be implemented simply as RC filters connected to the input/output terminals. An alternative is to use on chip inductors. The RC filters have proven to provide the best results. The input terminal of the preamplifier may be EMI protected by an on chip resistor connected to the input terminal of the preamplifier, in series with the transducer. In addition, an on chip capacitor may be connected between the input terminal and the ground terminal. The output terminal may be EMI protected by an on chip capacitor connected between the output terminal and the ground terminal of the preamplifier. In addition, an on chip resistor may be connected in series with the output.

In addition, a low pass, high pass, band pass or notch filter may be inserted between the two amplifier stages or after the second stage. Among additional features on the same ASIC as the preamplifier may also be: an Analog to Digital Converter connected to receive the signal from the second stage of the preamplifier, thus enabling a digital signal from the microphone assembly.

The two-stage preamplifier according to the present invention is especially suitable within telecommunication equipment such as mobile phones. This is due to the possibility of producing the preamplifier with very compact dimensions, still with the possibility of obtaining a high SNR when combined with the latest miniature microphone cartridges presently used in the telecom industry which have low cartridge source capacitance. The preamplifier also offers amplification and the possibility of being integrated into a microphone assembly with only two terminals, such as normally used for mobile phones.

Naturally the preamplifier is also suitable for integration into miniature microphone assemblies for use within other technical fields due to its high SNR combined with small dimensions. It is, of course, specially suited for applications requiring gain in the preamplifier and where it is preferred to have only two terminals from the microphone assembly.

In addition, it may also be possible to profit from the advantageous features of the preamplifier in combination with other types of transducers than microphones.

What is claimed is:

1. A preamplifier comprising a first and a second stage, wherein the first stage comprises a PMOS transistor having an input capacitance smaller than 10 pF on its input terminal, and wherein the second stage, comprising a NMOS transistor, is adapted to receive and amplify a signal from the first stage, the amplification of the received signal in the second stage being different from 1, wherein the amplified signal from the second stage is provided to an output terminal, said output terminal further being adapted to receive power from an external power supply so as to provide power to the preamplifier.

2. A preamplifier according to claim 1, wherein the preamplifier is implemented as an ASIC.

3. A preamplifier according to claim 2, wherein channel lengths and channel widths of the PMOS transistor are adjusted so as to obtain maximum SNR for a specific transducer connected to the input terminal of the first stage.

4. A preamplifier according to claim 1, further comprising means for providing EMI protection.

5. A preamplifier according to claim 4, wherein the means for providing EMI protection comprises an on chip resistor connected to the input terminal of the preamplifier.

6. A preamplifier according to claim 4, wherein the means for providing EMI protection comprises an on chip capacitor connected between the output terminal and the ground terminal of the preamplifier.

7. A preamplifier according to claim 1, further comprising filter means adapted to receive signals from the first stage of the preamplifier, and wherein an output signal from the filter means is provided as an input signal to the second stage of the preamplifier.

8. A preamplifier according to claim 7, wherein the filter means comprises a low pass filter.

9. A preamplifier according to claim 7, wherein the filter means comprises a high pass filter.

10. A preamplifier according to claim 7, wherein the filter means comprises a notch filter.

11. A preamplifier according to claim 1, further comprising at least one bias generator for setting idle current and idle voltage of at least one of the preamplifier stages.

12. A microphone assembly comprising
 a microphone assembly housing having a sound inlet port,
 a transducer for receiving acoustic waves, and for converting the received waves to analog signals, and
 a preamplifier according to claim 1, wherein the preamplifier is connected to the transducer via its input terminal so as to receive the analog transducer signal from the transducer.

13. A microphone assembly according to claim 12, wherein the transducer and the preamplifier are positioned within the microphone assembly housing, and wherein the output and ground terminal from the preamplifier is externally accessible.

14. A telecommunication device comprising a preamplifier according to claim 1.

15. A telecommunication device according to claim 14, wherein the telecommunication device is a mobile phone.

16. A telecommunication device comprising a microphone assembly according to claim 12.

17. A telecommunication device according to claim 16, wherein the telecommunication device is a mobile phone.

* * * * *

UNITED STATES PATENT AND TRADEMARK OFFICE
CERTIFICATE OF CORRECTION

PATENT NO. : 6,888,408 B2  Page 1 of 1
DATED : May 3, 2005
INVENTOR(S) : Claus Erdmann Fürst et al.

It is certified that error appears in the above-identified patent and that said Letters Patent is hereby corrected as shown below:

<u>Title page,</u>
Item [73], Assignee, change "Sonion Tech A/S" to -- Sonion A/S --.

Signed and Sealed this

Thirteenth Day of December, 2005

JON W. DUDAS
*Director of the United States Patent and Trademark Office*